United States Patent
Kim et al.

(10) Patent No.: US 8,110,751 B2
(45) Date of Patent: Feb. 7, 2012

(54) SEMICONDUCTOR MEMORY MODULE AND ELECTRONIC COMPONENT SOCKET FOR COUPLING WITH THE SAME

(76) Inventors: Dong You Kim, Cheongju-si (KR); Yong Tae Kyeon, Suwon-si (KR); Ja Yong Ku, Hwaseong-si (KR)

( * ) Notice: Subject to any disclaimer, the term of this patent is extended or adjusted under 35 U.S.C. 154(b) by 385 days.

(21) Appl. No.: 12/411,847

(22) Filed: Mar. 26, 2009

(65) Prior Publication Data

US 2010/0243308 A1    Sep. 30, 2010

(51) Int. Cl.
  *H05K 1/11*    (2006.01)
(52) U.S. Cl. .......................................... 174/261; 439/59
(58) Field of Classification Search ................. 174/261; 439/59
  See application file for complete search history.

(56) References Cited

U.S. PATENT DOCUMENTS

| | | | |
|---|---|---|---|
| 4,806,110 A * | 2/1989 | Lindeman | 439/108 |
| 5,040,999 A * | 8/1991 | Collier | 439/108 |
| 5,419,708 A * | 5/1995 | Koss et al. | 439/59 |
| 6,024,587 A * | 2/2000 | Garth | 439/101 |
| 6,421,250 B1 * | 7/2002 | Kim et al. | 361/784 |
| 6,674,644 B2 * | 1/2004 | Schulz | 361/728 |
| 6,926,561 B1 * | 8/2005 | Handforth et al. | 439/632 |
| 7,172,465 B2 * | 2/2007 | Kinsley | 439/637 |

* cited by examiner

*Primary Examiner* — Hae Moon Hyeon
(74) *Attorney, Agent, or Firm* — Kile Park Goekjian Reed & McManus PLLC

(57) ABSTRACT

The present invention relates to a semiconductor memory module and an electronic component socket for coupling with the same. A printed circuit board of the semiconductor memory module includes three signal pad arrays longitudinally formed in a row on one sides of a first surface, a second surface and a third surface thereof. Each signal pad array includes a plurality of signal pads. An electronic component socket for coupling with the printed circuit board includes thee pin arrays. Thus, an increased number of the signal pads can be provided while retaining the size of the memory module and the electronic component socket.

7 Claims, 5 Drawing Sheets

SEMICONDUCTOR MEMORY MODULE AND ELECTRONIC COMPONENT SOCKET FOR COUPLING WITH THE SAME

BACKGROUND OF THE INVENTION

1. Field of the Invention

The present invention relates to a semiconductor memory field, and more particularly, to a memory module on which a plurality of semiconductor memory devices are mounted and an electronic component socket for coupling with the same.

2. Background of the Related Art

Currently, along with the rapid development of an information industry including the Internet and a semiconductor industry supporting the information industry, the computers gradually follow a trend toward high capacity and high performance. Accordingly, the semiconductor memory devices used in the computers also follow the trend toward high capacity and high performance. Like this, a plurality of semiconductor memory devices is mounted on a single memory module in order to enhance the memory capacity of the computers. Nowadays, the most widely used dual in-line memory module is configured such that signal pads are arranged in one row on one side of each of a first surface and a second surface of a printed circuit board to have a total of two rows.

Referring to FIG. 1, a conventional dual in-line memory module 101 includes a printed circuit board 102, a plurality of semiconductor memory devices 103 mounted on at least one of a first surface and a second surface of the printed circuit board, and a first signal pad array 104 and a second signal pad array 105 for electrically connecting the semiconductor memory devices 103 to an external system. Each of the first and second signal pad arrays 104 and 105 includes a plurality of signal pads which are spaced apart from each other at regular intervals.

Referring to FIG. 2, a conventional electronic component socket 201 is mounted to an external circuit board 301 and includes a first pin array 204 and a second pin array 205, each of which consists of a plurality of metal pins. The electronic component socket 201 is coupled with the dual in-line memory module 101 shown in FIG. 1. When the dual in-line memory module 101 is coupled to the electronic component socket 201, the signal pads thereof are electrically connected to the metal pins of the electronic component socket 201 so as to be electrically connected to first and second signal pad arrays 304 and 305 mounted on the external circuit board 301.

In order to further greatly improve performance and memory capacity of the conventional dual in-line memory module 101, it is required that the number of signal pads mounted on the first and second surfaces of the printed circuit board should increase. To this end, the pitch between the signal pads should be reduced or the size of the printed circuit board 102 should further greatly increase. However, there is a technical limitation in reducing the pitch between the signal pads. Thus, the size of the printed circuit board 102 should inevitably increase greatly in order to increase the number of signal pads, which leads to an increase in the size of the electronic component socket 201 coupled with the printed circuit board, and ultimately an increase in the size of a system board. This goes against the current trend toward the miniaturization and lightness of the system.

In addition, although it is desired to reduce the size of the memory module having the same performance as in the prior art, the size of the memory module cannot be reduced because of the first signal pad array 204 and the second signal pad array 205 mounted on the first surface and the second surface of the printed circuit board as shown in FIG. 3. This also goes against the current trend toward the miniature and lightness of the system.

SUMMARY OF THE INVENTION

Therefore, the present invention has been made in view of the above problems, and it is an object of the present invention to provide a memory module which can increase the number of pins while retaining the size of the printed circuit board, a semiconductor memory module which is reduced in size but has the same performance as in the prior art while retaining the pitch between the signal pads.

In order to accomplish the above object, in one aspect, the present invention provides a semiconductor memory module including a printed circuit board which includes as a first surface, a second surface and a third surface as circuit surfaces and on which a plurality of semiconductor devices are mounted at least one of the first surface and the second surface, wherein the printed circuit board comprises:

a first signal pad array longitudinally formed in a row on one side of the first surface thereof, the first signal pad array including a plurality of signal pads;

a second signal pad array longitudinally formed in a row on one side of the second surface thereof which is opposite to the first surface thereof, the second signal pad array being arranged in parallel with the first signal pad array and including a plurality of signal pads; and a third signal pad array formed longitudinally formed on the third surface thereof which is disposed adjacent to and perpendicular to the first surface, the third signal pad array including a plurality of signal pads, and wherein the third signal pad array includes as signal pads protruding portions in which a plurality of internal circuits of the printed circuit board protrudes to the outside of an insulating layer.

Preferably, the protruding portions may be formed to have a predetermined thickness by plating the cross-sections of the internal circuits or removing the insulating layer.

Also, preferably, the plurality of signal pads included in the third signal pad array may be configured such that the protruding portions are arranged in parallel with each other and electrically connected to each other through a via hole.

By adding the third signal pad array to the first signal pad array and the second signal pad array, the number of the signal pads can increase while retaining the size of the printed circuit board.

In order to accomplish the above object, in another aspect, the present invention provides an electronic component socket for coupling with the semiconductor memory module according to any one of claims 1 to 6, comprising:

an insertion portion for allowing one side of a printed circuit board to be insertedly coupled thereto; and an insulating material for surrounding the outer surface of the insertion portion, wherein the insertion portion includes:

a first pin array longitudinally formed on the inner wall of one side thereof, the first pin array including a plurality of signal pins;

a second pin array longitudinally formed on the inner wall of the other side thereof, the first pin array being arranged opposite to and in parallel with the first pin array and including a plurality of signal pins; and a third pin array longitudinally formed on the bottom surface thereof, the third pin array including a plurality of signal pins.

Preferably, the signal pins may have elasticity.

Also, preferably, the signal pins of the third pin array may be simultaneously brought into close contact with a plurality of signal pads.

In order to accomplish the above object, in another aspect, the present invention provides a semiconductor memory module including a printed circuit board which includes as a first surface, a second surface and a third surface as circuit surfaces and on which a plurality of semiconductor components are mounted at least one of the first surface and the second surface, wherein the printed circuit board comprises:

a first signal pad array longitudinally formed in a row on one side of the first surface thereof, the first signal pad array including a plurality of signal pads;

a second signal pad array longitudinally formed in a row on one side of the second surface thereof which is opposite to the first surface thereof, the second signal pad array being arranged in parallel with the first signal pad array and including a plurality of signal pads; and a third signal pad array formed longitudinally formed on the third surface thereof which is disposed adjacent to and perpendicular to the first surface, the third signal pad array including a plurality of signal pads connected to a plurality of internal circuits of the printed circuit board in such a fashion as to intersect perpendicular to the internal circuits of the printed circuit board.

Preferably, the signal pads of the third signal pad array may be formed by a plating or a conductive paste, and the signal pads of the third signal pad array may include notches formed therebetween so as to electrically separate each of the signal pads.

DETAILED DESCRIPTION OF THE PREFERRED EMBODIMENT

The preferred embodiments of the invention will be hereinafter described in detail with reference to the accompanying drawings.

Figure 1:
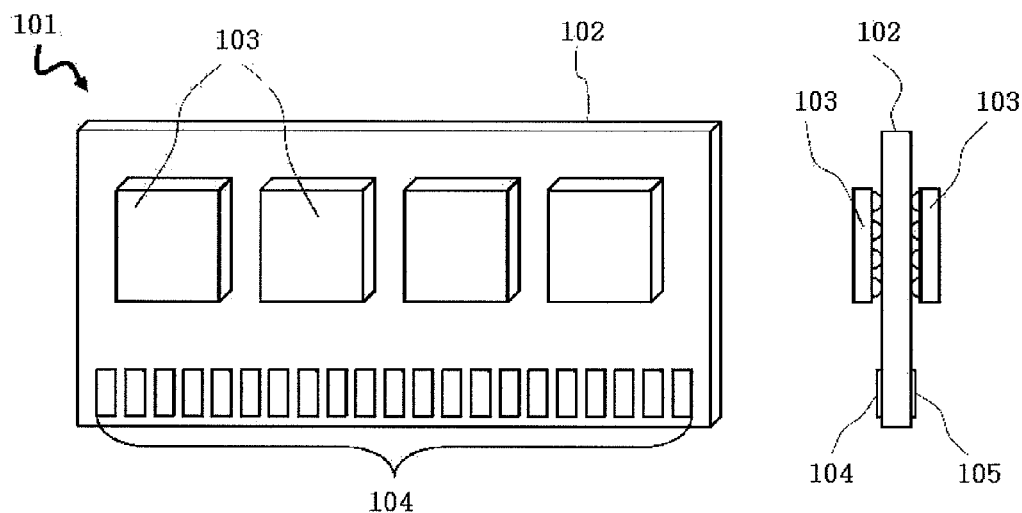
FIG. 1 is a front view and side view illustrating a first surface of a printed circuit board of a conventional memory module according to the prior art.
Figure 2:
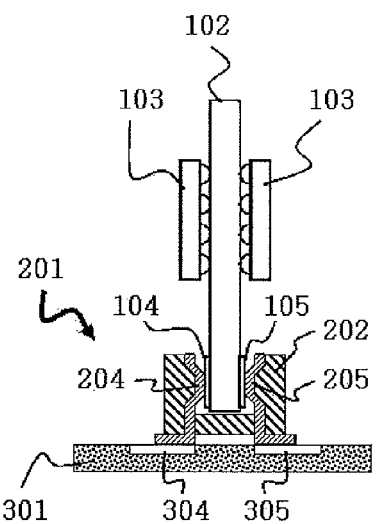
FIG. 2 is a cross-sectional view illustrating the coupling structure of the conventional memory module and an electronic component socket.
Figure 3:
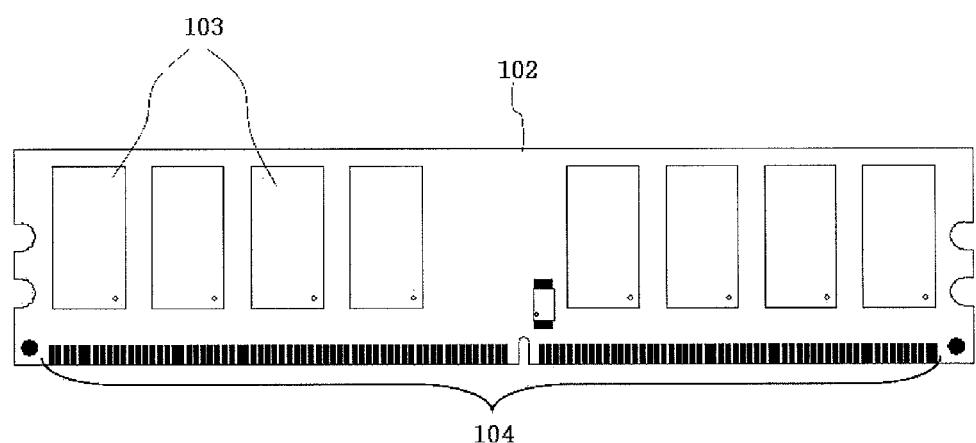
FIG. 3 is a view illustrating an example of a conventional actual memory module.
Figure 4:
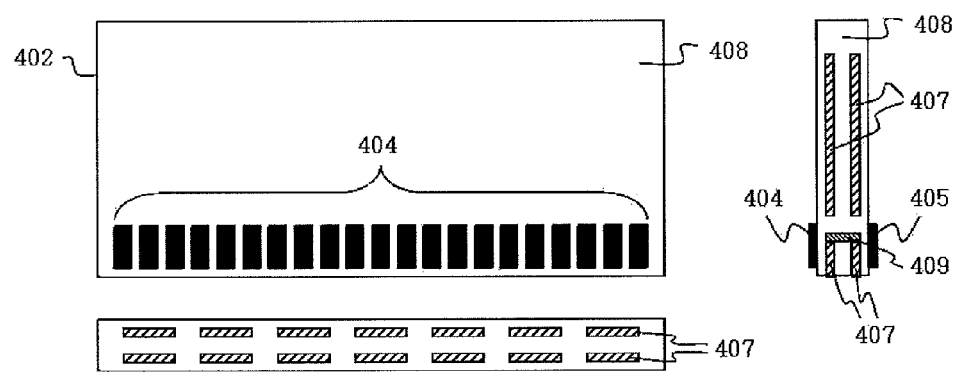
FIG. 4 is a front, bottom and cross-sectional view illustrating a typical printed circuit board having a first surface and a third surface for implementing one embodiment of the present invention.

FIG. 4 is a front, bottom and cross-sectional view illustrating an initial structure of a printed circuit board 402 having a first surface and a third surface for according to one embodiment of the present invention.

First, as shown in FIG. 4, the initial printed circuit board 402 is manufactured by a typical manufacturing method and includes a first signal pad array 404 formed on a first surface thereof, a second signal pad array 405 formed on a second surface thereof, and a plurality of internal circuits 407 formed therein. Particularly, the internal circuits arranged in a third surface of the printed circuit board 402 are electrically connected to each other by means of a via hole 409.

Figure 5:
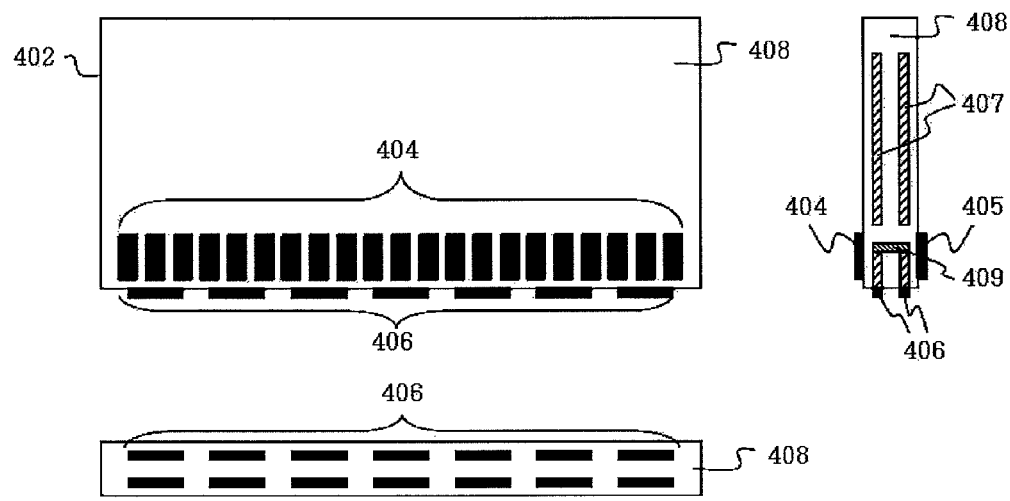
FIG. 5 is a front, bottom and cross-sectional view illustrating a completed printed circuit board having a first surface and a third surface mounted with first, second and third signal pad arrays according to one embodiment of the present invention.

The cross-sections of internal circuits 407 exposed to the outside from the third surface of the thus manufactured printed circuit board 402 are subjected to a copper electroplating treatment so as to allow the internal circuits 407 to protrude to the outside of an insulating material 408 to a length of from 0.015 to 0.3 mm as shown in FIG. 5, and then the surfaces of the protruding internal circuits 407 are plated with nickel (Ni) and gold (Au) to thereby form a third signal pad array 406.

The semiconductor memory devices 403 are mounted on at least one of the three surfaces of the printed circuit board 402 including the three signal pad arrays 404, 405 and 406 to thereby complete the memory module 401 of the present invention.

Figure 6:
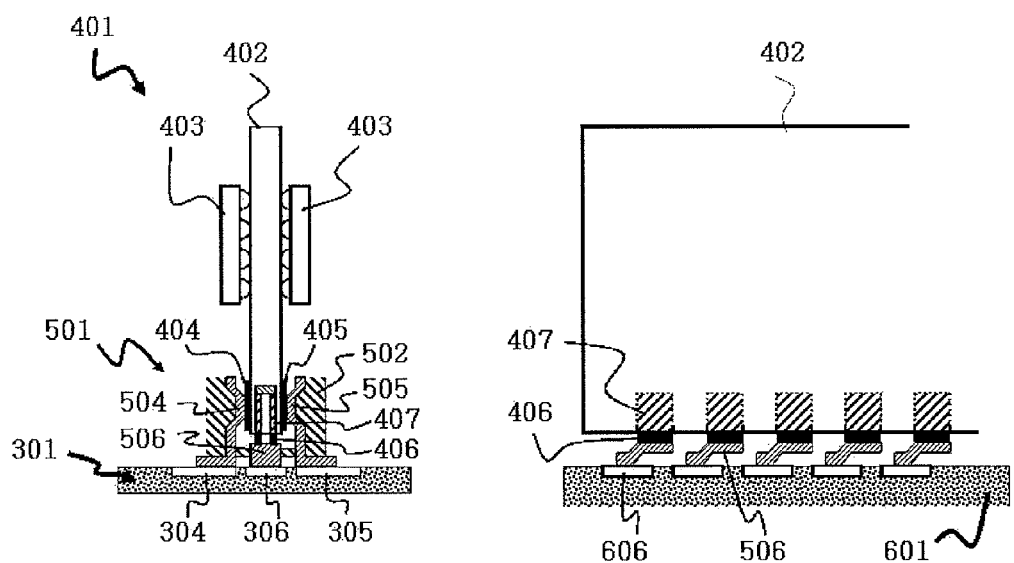
FIG. 6 is a cross-sectional view illustrating the coupling structure of a memory module and an electronic component socket and a virtual view illustrating the connection structure for a third signal pad array according to one embodiment of the present invention.

An electronic component socket 501 suited for the memory module 401 is manufactured in order to mount the completed memory module 401 on a system board (external circuit board) as shown in FIG. 6. The electronic component socket 501 includes an insertion portion for allowing one side of the first surface, one side of the second surface and the third surface of the printed circuit board 402 to be inserted thereto, and an insulating material 502 for surrounding the outer surface of the insertion portion. The insertion portion includes a first pin array 504 formed on the inner wall of one side thereof to have the same pitch as that of the first signal pad array 404 formed on the printed circuit board 402, and a second pin array 505 formed on the inner wall of the other side thereof to have the same pitch as that of the second signal pad array 405 formed on the printed circuit board 402. In this case, the second pin array 505 is arranged opposite to and in parallel with the first pin array 504. Also, the insertion portion includes a third pin array 506 formed on the bottom surface thereof to have the same pitch as that of the third signal pad array 406 formed on the printed circuit board 402. Thus, when the memory module 401 is insertedly coupled to the electronic component socket 501, the first, second and third signal pad arrays 404, 405 and 406 are brought into close contact with and electrically connected to the first, second and third pin arrays 504, 505 and 506.

In this case, the signal pins arranged on the first, second and third pin arrays 504, 505 and 506 are made to have elasticity in order to improve reliability of their contact with the signal pads arranged on the first, second and third signal pad arrays 404, 405 and 406.

In this case, the signal pin of the third pin array 506 is made to have a sufficient width so that a plurality of signal pads is bought into close contact with a single signal pin in a row in order to improve reliability of their contact with the signal pads of the third signal pad array 406 and reduce the electrical contact resistance against the signal pads of the third signal pad array 406.

Figure 7:
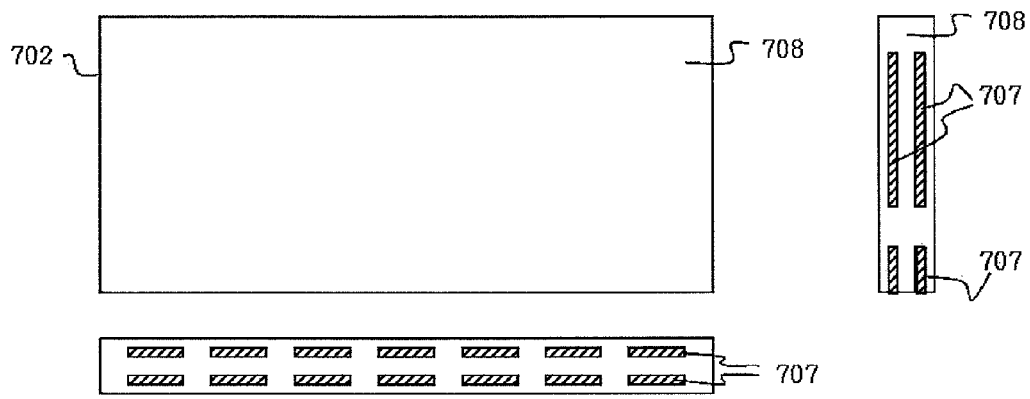
FIG. 7 is a front, bottom and cross-sectional view illustrating a typical printed circuit board having a first surface and a third surface for implementing another embodiment of the present invention.
Figure 8:
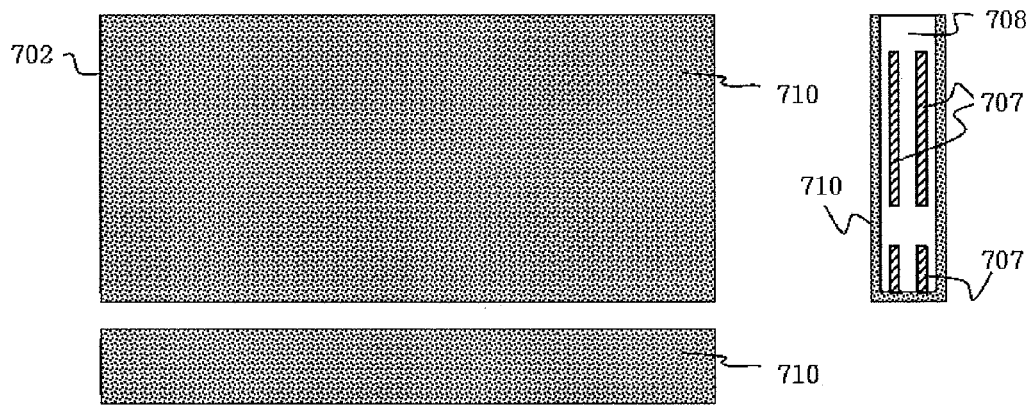
FIG. 8 is a front, bottom and cross-sectional view illustrating a printed circuit board having a first surface, a second surface and a third surface formed with a metal layer, respectively, according to another embodiment of the present invention.
Figure 9:
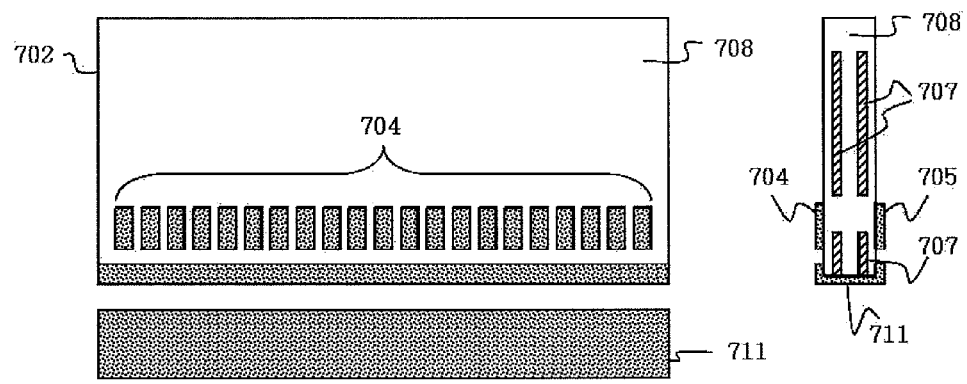
FIG. 9 is a front, bottom and cross-sectional view illustrating a printed circuit board having a first surface and a second surface formed with a circuit, respectively, according to another embodiment of the present invention.
Figure 10:
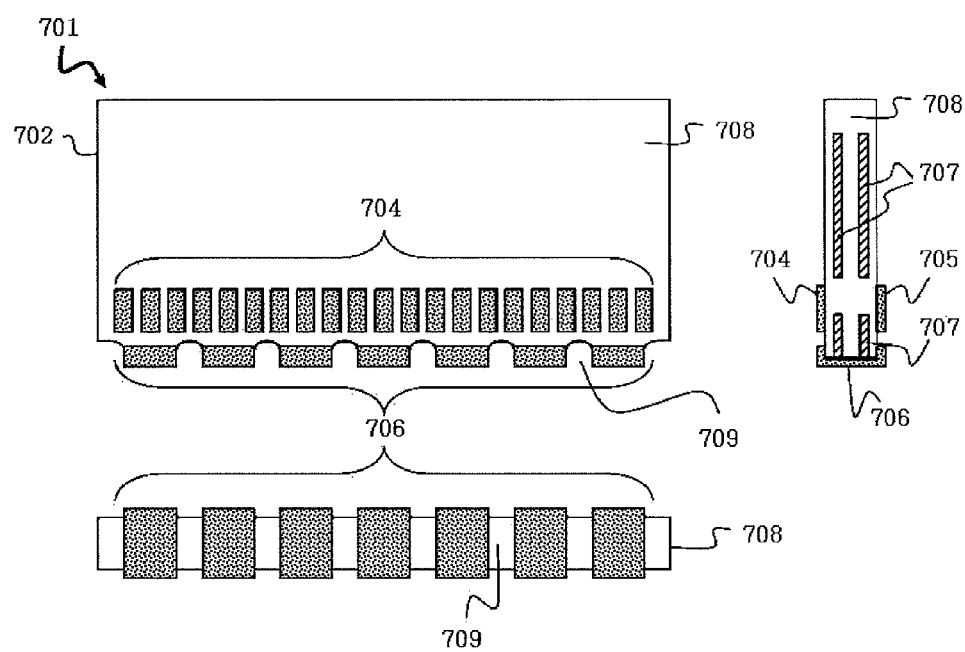
FIG. 10 is a front, bottom and cross-sectional view illustrating a completed printed circuit board having a first surface and a third surface mounted with first, second and third signal pad arrays according to another embodiment of the present invention.

FIGS. 7 to 9 illustrate a printed circuit board manufactured according to another embodiment of the present invention.

A printed circuit board 702 formed with a plurality of internal circuits 707 in an Insulation material 708 by a typical manufacturing method includes a metal layer formed on the first, second and third surfaces thereof as shown in FIG. 8. In this case, the internal circuits 707 exposed to the outside from the third surface of the printed circuit board 702 are connected to the metal layer 710. In this case, since a typical metal film has been previously attached on the first and second surfaces of the printed circuit board, a new metal layer 710 may be formed on the metal film. The metal layer 710 is formed by performing an electroless chemical plating process, followed by an electroplating treatment thereon. The printed circuit board 702 formed with the metal layer 710 is subjected to an etching process to thereby implement a circuit on the first and second surfaces thereof as shown in FIG. 9. In this case, a first signal pad array 704 and a second signal pad array 705 are formed together. In addition, a large single pad 711 is formed on the third surface of the printed circuit board 702. A plurality of notches 709 is formed at predetermined positions of the large single pad 711 formed on the third surface of the printed circuit board 702 so as to divide the single pad 711 into a plurality of small signal pads to thereby form a third signal pad array 706.

As described above, since the memory module according to the present invention includes a printed circuit board having three signal pad arrays, it can further increase the number of signal pads while retaining the size of the memory module.

In addition, when a conventional memory module adopting two signal pad arrays is replaced with an inventive memory module adopting three signal pad arrays, an unnecessary space of the printed circuit board can be removed with an increase in the number of signal pads, so that it is possible to implement a semiconductor memory module which is reduced in size but has the same performance as in the conventional memory module. Thus, it is possible to realize miniaturization and lightness of lots of systems employing the memory module and electronic component socket according to the present invention without degrading the performance of the systems.

Further, the number of signal pads increases while retaining the size of the memory module 401 so that a memory module employing a more sophisticated performance in the future can be mounted on an external circuit board having the same area as that of a conventional external circuit board.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A printed circuit board which includes a first side surface and a second side surface on which a plurality of semiconductor devices are mounted, wherein the printed circuit board comprises:

a first signal pad array longitudinally formed in a row on the first side surface, the first signal pad array including a plurality of signal pads;

a second signal pad array longitudinally formed in a row on the second side surface which is opposite to the first surface, the second signal pad array being arranged in parallel with the first signal pad array and including a plurality of signal pads; and a third signal pad array longitudinally formed on a bottom surface of the printed circuit board, the bottom surface being disposed between and perpendicular to the first and second side surfaces, wherein the third signal pad array includes a plurality of signal pads which are separated by a plurality of notches which are formed at the bottom surface of the printed circuit board and have a predetermined distance between adjacent ones of the notches.

2. The printed circuit board according to claim 1, wherein the signal pads of the third signal pad array include protruding portions in which internal circuits of the printed circuit board are protruded to outside of an insulating layer, the protruding portions being formed to have a predetermined thickness by plating cross-sections of the internal circuits or removing the insulating layer.

3. The printed circuit board according to claim 2, wherein the plurality of signal pads of the third signal pad array is configured such that the protruding portions are arranged in parallel with each other and electrically connected to each other through a via hole.

4. A printed circuit board according to claim 1, wherein the signal pads of the third signal pad array are formed by a plating or a conductive paste.

5. An electronic component socket for coupling with the printed circuit board according to claim 1, comprising:

an insertion portion for allowing one side of the printed circuit board to be insertedly coupled thereto; and an insulating material for surrounding the outer surface of the insertion portion, wherein the insertion portion includes:

a first pin array longitudinally formed on an inner wall of one side of the insertion portion, the first pin array including a plurality of signal pins;

a second pin array longitudinally formed on an inner wall of the other side of the insertion portion, the first pin array being arranged opposite to and in parallel with the first pin array and including a plurality of signal pins; and a third pin array longitudinally formed on a bottom surface of the insertion portion, third pin array including a plurality of signal pins.

6. The electronic component socket according to claim 5, wherein the signal pins have elasticity.

7. The electronic component socket according to claim 5, wherein the signal pins of the third pin array are simultaneously brought into close contact with the plurality of signal pads of the third signal pad array.

* * * * *